United States Patent
Pawlowski

(10) Patent No.: US 11,456,034 B2
(45) Date of Patent: *Sep. 27, 2022

(54) FULLY ASSOCIATIVE CACHE MANAGEMENT

(71) Applicant: Micron Technology, Inc., Boise, ID (US)

(72) Inventor: Joseph T. Pawlowski, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/332,579

(22) Filed: May 27, 2021

(65) Prior Publication Data

US 2021/0358548 A1   Nov. 18, 2021

Related U.S. Application Data

(63) Continuation of application No. 16/555,956, filed on Aug. 29, 2019, now Pat. No. 11,024,382.

(51) Int. Cl.
*G11C 15/04* (2006.01)
*G11C 11/409* (2006.01)
(Continued)

(52) U.S. Cl.
CPC ........ *G11C 15/046* (2013.01); *G06F 11/1064* (2013.01); *G06F 12/0891* (2013.01); *G06F 12/1036* (2013.01); *G11C 11/409* (2013.01)

(58) Field of Classification Search
CPC ..... G11C 15/046; G11C 11/409; G11C 15/04; G11C 2207/2245; G06F 11/1064;
(Continued)

(56) References Cited

U.S. PATENT DOCUMENTS

| 9,213,646 B1* | 12/2015 | LaPanse | G06F 3/06 |
| 2003/0188105 A1* | 10/2003 | Middleton | G06F 12/0864 |
| | | | 711/E12.047 |

(Continued)

FOREIGN PATENT DOCUMENTS

JP   2018088212 A   6/2018

OTHER PUBLICATIONS

ISA/KR, International Search Report and Written Opinion of the International Searching Authority, Int'l Appl. No. PCT/US2020/047203, dated Nov. 25, 2020, Korean Intellectual Property Office, Seo-gu, Daejeon, Republic of Korea, 11pgs.

*Primary Examiner* — Tri M Hoang
(74) *Attorney, Agent, or Firm* — Holland & Hart LLP

(57) ABSTRACT

Methods, systems, and devices for fully associative cache management are described. A memory subsystem may receive an access command for storing a first data word in a storage component associated with an address space. The memory subsystem may include a fully associative cache for storing the data words associated with the storage component. The memory subsystem may determine an address within the cache to store the first data word. For example, the memory subsystem may determine an address of the cache indicated by an address pointer (e.g., based on the order of the addresses) and determine a quantity of accesses associated with the data word stored in that cache address. Based on the indicated cache address and the quantity of accesses, the memory subsystem may store the first data word in the indicated cache address or a second cache address sequential to the indicated cache address.

20 Claims, 8 Drawing Sheets

(51) Int. Cl.
*G06F 11/10* (2006.01)
*G06F 12/0891* (2016.01)
*G06F 12/1036* (2016.01)

(58) Field of Classification Search
CPC .............. G06F 12/0891; G06F 12/1036; G06F 2212/1021; G06F 2212/1032; G06F 2212/7201; G06F 2212/7208; G06F 12/0292; G06F 12/0871; G06F 12/0864
See application file for complete search history.

(56) References Cited

U.S. PATENT DOCUMENTS

| | | | |
|---|---|---|---|
| 2006/0190686 A1 | 8/2006 | Tsuboi | |
| 2011/0289257 A1* | 11/2011 | Hathaway | ............... G06F 12/12 711/3 |
| 2015/0309944 A1 | 10/2015 | Sadoughi-yarandi et al. | |
| 2020/0073805 A1* | 3/2020 | Park | ................... G06F 12/0815 |

* cited by examiner

FULLY ASSOCIATIVE CACHE MANAGEMENT

CROSS REFERENCE

The present Application for Patent is a continuation of U.S. patent application Ser. No. 16/555,956 by Pawlowski, entitled "FULLY ASSOCIATIVE CACHE MANAGEMENT," filed Aug. 29, 2019, and issued on Jun. 1, 2021, as U.S. Pat. No. 11,024,382, assigned to the assignee hereof, and is expressly incorporated by reference in its entirety herein.

BACKGROUND

The following relates generally to a system that includes at least one memory device and more specifically to fully associative cache management.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

Improving a system may include enhancing a memory subsystem's performance such as reducing power consumption, increasing memory capacity, improving read/write speeds, providing non-volatility by use of persistent memory media, or reducing manufacturing costs at a certain performance point, among other metrics. Some types of memory may have limits with regard to a number of access operations (e.g., write operations and/or read operations) that may be performed on each cell without degradation in memory performance. In addition, some patterns of memory accesses may frequency access certain regions of memory, including some that may intentionally try to disrupt the stored memory states. Thus, maintaining memory performance under various conditions, including the presence of malicious actors, may provide challenges.

DETAILED DESCRIPTION

Figure 1:
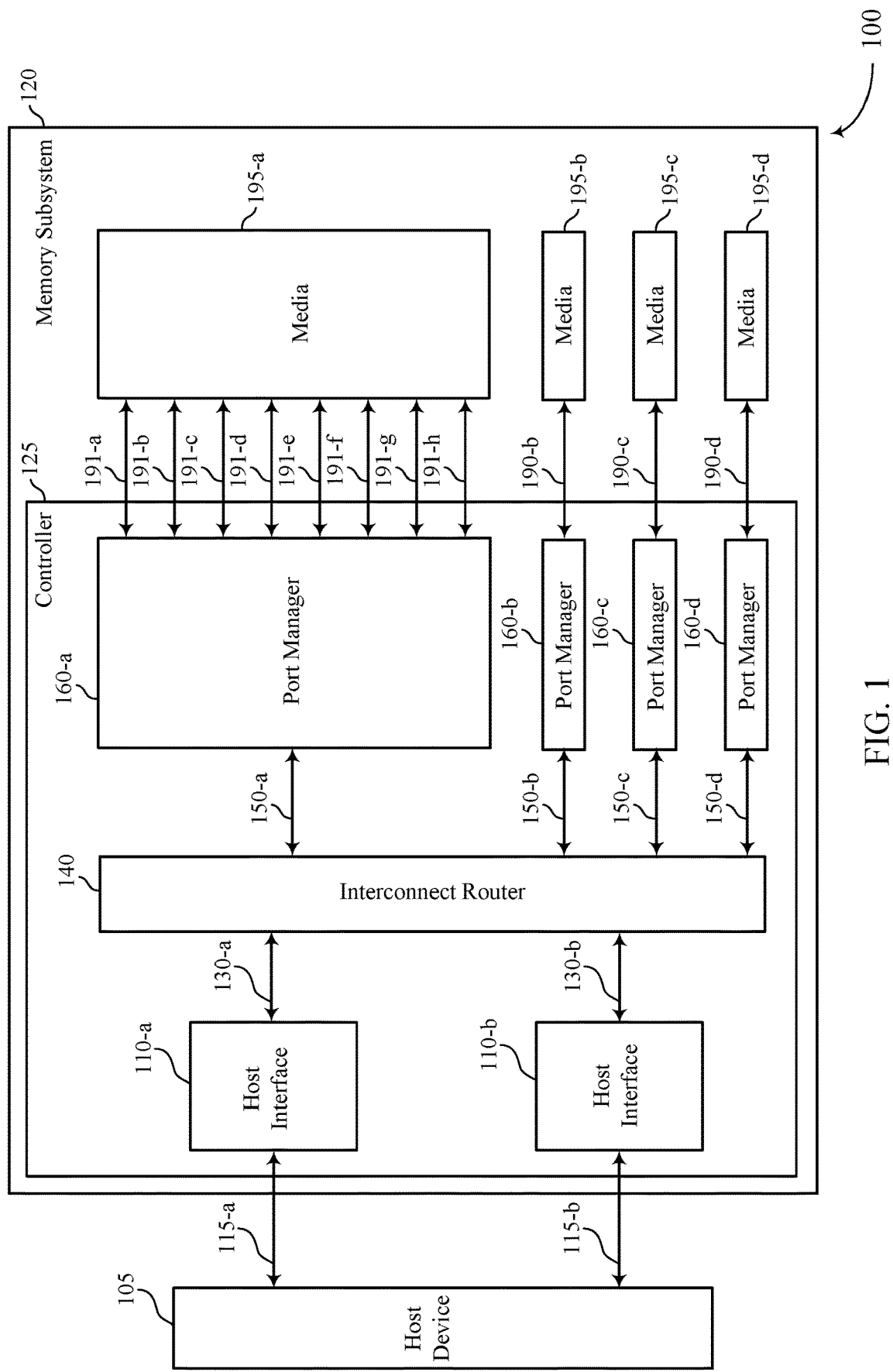
FIG. 1 illustrates an example of a system that supports fully associative cache management in accordance with examples as disclosed herein.

Memory cells of a memory device may wear-out or stop reliably storing a memory state when the quantity of access operations (e.g., reads, writes, etc.) to those cells surpassing a wear threshold. In some cases, one or more memory cells may be subjected to a higher concentration of access operations, for example, due to normal operations of a memory device or a malicious attack. Accordingly, some memory cells may wear-out before other, less accessed, memory cells of a memory array. As such, logic states stored at those cells may become corrupted, or if identified, a memory device may need to dedicate resources to correcting errors or storing data associated with worn out memory cells.

In some cases, a memory system may employ cache memory to reduce a quantity of accesses associated with a memory device (e.g., memory media). In some cases, the cache may be fully associative (e.g., each address within the cache may be configured to store data associated with any address of the corresponding memory device). When a host device issues an access command, the memory system may determine if data associated with an address indicated by the access command is included within the cache memory. In a case that the memory system determines that the cache includes valid data associated with the memory device (e.g., a cache hit), the memory system may execute the access command at the cache. Alternatively, the memory system may determine that the cache does not include valid data at the cache (e.g., a cache miss).

In the case of a cache miss, the memory system may determine an address within the cache to store data associated with the address indicated by the access command. If the cache is full, the memory system may determine to evict data from an address of the cache. In some cases, the memory system may refer to an address pointer indicating an address to evict. The memory system may determine to evict either the address indicated by the address pointer or a sequential address to the address indicated by the address pointer. The memory system may determine which cache address to evict (e.g., the cache address indicated by the pointer, the sequential cache address) based on a quantity of accesses associated with each address.

Each cache address may be configured to store codewords (e.g., data words) according to a size of the memory device. In some cases, a host device may perform access operations based on a different codeword size. For example, the size of a codeword stored at the memory device may be a multiple of the size of a codeword used by the host device. While each cache address corresponds to a single memory device address, each cache address may further be configured to store a codeword that is a same size as a codeword indicated by the host device within a portion of the memory associated with the cache address.

Features of the disclosure are initially described in the context of a system as described with reference to FIG. 1. Features of the disclosure are further described in the context of memory subsystems and a process flow as described with reference to FIGS. 2-4. These and other features of the disclosure are further illustrated by and described with reference to an apparatus diagram and flowcharts that relate to fully associative cache management as described with references to FIGS. 5-8.

FIG. 1 illustrates an example of a system 100 that supports fully associative cache management in accordance with examples as disclosed herein. The system 100 may include a host device 105 coupled with a memory subsystem 120 using host links 115. The memory subsystem 120 may include a controller 125 and media devices 195, which may be examples of various memory devices or storage components. The controller 125 may include host interfaces 110, an interconnect router 140, port managers 160, and memory media 195, which may be examples of various memory devices and storage components. The components within the memory subsystem 120 may be in electronic communication with one another by one or more busses.

The host device 105 may be a server, a system on a chip (SoC), a central processing unit (CPU), or a graphics processing unit (GPU). The host device 105 may access (e.g., read from, write to) one or more memory media 195 located in the memory subsystem 120 through the host links 115. The host links 115 may employ a protocol (e.g., the Gen-Z, the cache coherent interconnect for accelerators (CCIX) protocol). The host links 115 may be configured to transfer data at a data transfer rate. For example, the host link 115 may be configured to transfer data at a data transfer rate (e.g., 25 gigabytes per second (GBps)) each direction (e.g., sending or receiving) through the host link 115. In some examples, a 25 GBps data transfer rate may support 586 million transactions per second when a transaction is 64 bytes. In other examples, a 25 GBps data transfer rate may support 112.5 million transactions per second when a transaction is 128 bytes. More than one host link 115 may increase the data transfer rate between the host device 105 and the memory subsystem 120. For example, the memory subsystem 120 may be configured to transfer data at a data transfer rate of 100 GBps due to the two host links 115-*a* and 115-*b*, which may each be configured to transfer data at 50 GBps.

The system 100 may include the memory subsystem 120. The memory subsystem 120 may be a memory component, computing device, electronic device, mobile computing device, or wireless device. For example, the memory subsystem 120 may be a portable electronic device such as a computer, a laptop computer, a tablet computer, a smartphone, a cellular phone, a wearable device, an internet-connected device, or the like. In some cases, the memory subsystem 120 may be configured for bi-directional wireless communication with or via a base station or access point. The memory subsystem 120 may be referred to as a memory device or memory devices.

The memory subsystem 120 may include a controller 125 and memory media 195. In some examples, the controller 125 and the memory media 195 may be integrated with, in contact with, or placed on a board (e.g., a peripheral component interconnect express (PCIe) board). The controller 125 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components.

The controller 125 may be configured to interface with the host device 105 and the memory media 195. The controller 125 may receive, from the host device 105, a first access command for the memory media 195. For example, the controller 125 may receive a first access command indicating to read data from or write data to the memory media 195. The controller 125 may generate a second access command for execution at the memory media 195 based on the first access command. For example, the host device 105 may be operable to perform access operations according to a first codeword size (e.g., 64 bytes) while the memory media 195 may be operable to perform access operations according to a second codeword size (e.g., 128 bytes). A codeword may be the smallest unit of data that the host device 105 or the memory media 195 may control (e.g., a granularity of data transactions). Here, the first access command may indicate an access operation based on a 64 byte codeword while the second access command may indicate the same access operation but based on a 128 byte codeword. In another example, the controller 125 may be operable to distribute access operations across the memory media 195 to control a wear level associated with a part of the memory media 195. That is, sequential logical addresses at the host device 105 may be interleaved across more than one memory media 195. Here, the first access command may indicate an access operation based on one or more sequential addresses at the host device 105, while the second access command may indicate an access operation on non-sequential addresses within the media 195. In some cases, the non-sequential addresses may be associated with different media 195 (e.g., media 195-*a*, media 195-*b*). As a result, the memory subsystem 120 may execute an access operation corresponding to logical addresses in parallel. For example, port manager 160-*a* may facilitate an execution of a portion of the access operation on a first subset of the logical addresses within the media 195-*a* while port manager 160-*b* facilitates an execution of a second portion of the access operation on a second subset of the logical addresses within the media 195-*b*.

The controller 125 may include one or more host interfaces 110 that may be coupled with the host device 105 using the host links 115 that employs an interface protocol (e.g., the Gen-Z protocol, the CCIX protocol) as explained above. The host interfaces 110 may include physical layers for transmitting and receiving data through the host links 115 coupled with the host device 105.

The controller 125 may also include an interconnect router 140 coupled between the host interfaces 110 and one or more port managers 160. The interconnect router 140, in some examples, may provide a routing network to allow more than one host link 115 to connect to more than one memory media 195 associated with the port managers 160. For example, the interconnect router 140 may communicate data or addresses (e.g., associated with an access command) between a host interface 110 by a signal path 130 to a port manager 160 by a signal path 150. The interconnect router 140 may be an array of switches. By way of example, the system 100 illustrates that the first host link 115-*a*, using the host interface 110-*a*, may connect to one or more port managers (e.g., 160-*a*, 160-*b*, 160-*c*, and 160-*d*) while the second host link 115-*b*, using the host interface 110-*b*, may concurrently connect to the one or more port managers (e.g., 160-*a*, 160-*b*, 160-*c*, and 160-*d*).

During the routing process, the interconnect router 140 may generate interleaved addresses based on the host addresses (e.g., sequential addresses designated with a block of memory space) to distribute the request from the host device 105 across multiple memory media 195. So the host address (e.g., sequential addresses) may be in the domain of the host interface 110 while the interleaved addresses may be in the domain of the port managers 160 and associated memory media 195. The interleaved addressing scheme may, in some examples, be configured to leave no gap in the block of memory space associated with the host address (e.g., sequential addresses). In some examples, the interconnect router 140 may exchange data with the port managers 160 through signal paths 150.

Each port manager 160 may include cache memory to reduce a quantity of accesses associated with a corresponding media 195. For example, a cache memory associated with the port manager 160-*c* may act to reduce a quantity of accesses to media 195-*c*. In some cases, the cache may be fully associative (e.g., each address within the cache may be configured to store data associated with any address of the corresponding media 195). When the host device 105 issues an access command (e.g., comprising an indication of an access operation, a logical address associated with the access operation, and, in some cases, data to be written to the media 195), a port manager 160 may determine a media address of the media 195 indicated by the logical address.

The port manager 160 may determine whether the cache includes valid data associated with the media address. In a case that the port manager 160 determines that the cache includes valid data associated with the media address (e.g., a cache hit), the port manager 160 may execute the access command at the cache. Alternatively, the port manager 160 may determine that the cache does not include valid data at the cache (e.g., a cache miss). In the case of a read operation, the port manager 160 may retrieve the data associated with the media address from the corresponding media 195 and store the retrieved data at the cache. For example, if port manager 160-*b* determines that a cache at the port manager 160-*b* does not include valid data associated with a media address (e.g., indicated by an access command), the port manager 160-*b* may retrieve the data from the media address within the media 195-*b*.

The port manager 160 may store the data associated with the access command (e.g., retrieved from the media 195 in the case of a read operation, included within the access command in the case of a write operation) at an address of the cache. The port manager 160 may then associate the address of the cache with the media address indicated within the access command. In some cases, the port manager 160 may store the data associated with the access command at a location within the cache that does not have any valid data. That is, the cache may not be full and the port manager 160 may store the data at an empty address within the cache. In another case, the port manager 160 may determine to evict valid data (e.g., associated with a different media address) from the cache to store the data associated with the access operation. Here, the port manager 160 may determine an address of the cache from which to evict data. During the eviction process, the port manager 160 may then ensure that the media address previously associated with the cache address is storing the same data as the data stored within the cache. Then, the port manager 160 may write the data associated with the access operation to at least a portion of the memory associated with the cache address, and update the cache address to be associated with the media address indicated by the access command.

In the case that each cache address is storing valid data (e.g., the cache is full), the port manager 160 may evict addresses of the cache based on an order of the addresses. For example, the port manager 160 may refer to an address pointer indicating an address to evict. The port manager 160 may determine to evict either the address indicated by the address pointer or a sequential address to the address indicated by the address pointer. The port manager 160 may determine which cache address to evict (e.g., the cache address indicated by the pointer, the sequential cache address) based on a quantity of accesses associated with each address. For example, if the address pointer indicates a first address associated with three (3) accesses and a second address (e.g., next to the first address according to the order indicated by the address pointer) is associated with one (1) access, the port manager 160 may determine to evict the contents of the second address.

Each cache address may be configured to store codewords (e.g., data words) according to a size of the media 195. In some cases, the host device 105 may perform access operations based on a different codeword size. For example, the size of a codeword stored at a media address within a media 195 a multiple of the size of a codeword used by the host device 105. For example, the media 195 store data codewords with a size that is two (2), three (3), or four (4) times greater than the codeword size of data stored at the host device 105. While each cache address corresponds to a single media address (e.g., and is configured to store a single codeword that is the same size as a codeword stored at the media 195), each cache address may further be configured to store a codeword that is a same size as a codeword indicated by the host device 105 within a portion of the memory associated with the cache address. For example, each cache address may be configured to store a single 128 byte codeword corresponding to a media codeword size. Each cache address may further be configured to store a 64 byte codeword (e.g., associated with a host codeword size) within a portion of the memory associated with the cache address.

In some examples, an individual port manager 160 (e.g., the port manager 160-*b*) may be coupled with one of memory media 195 (e.g., the memory media 195-*b*) through one of aggregated channels 190 (e.g., the aggregated channel 190-*b*). An individual channel of the aggregated channels 190 may include one or more logical channels 191. In some examples, each of the aggregated channels 190 may include eight logical channels 191. Eight logical channels (e.g., the logical channel 191-*a* through the logical channel 191-*h*) are illustrated for the port manager 160-*a*, which may represent a single aggregated channel 190 (e.g., an aggregated channel 190-*a* that is not shown). The aggregated channels 190 (e.g., the aggregated channel 190-*b*, 190-*c*, and 190-*d*) are illustrated for port managers 160-*b*, 160-*c*, and 160-*d* in an effort to increase visibility and clarity of the depicted features. Each aggregated channel 190 may include additional channels to carry information related to various auxiliary functions such as error-correction code (ECC) or metadata.

A memory media 195 (e.g., memory media 195-*a*) may include multiple memory dice (e.g., sixteen memory dice) to obtain a desired memory capacity. Each memory die may include a local controller to collaborate with the controller 125 and to manage various memory operations within the memory die. In some examples, the memory dice may include non-volatile memory cells (e.g., 3DXP array of phase change memory cells). In other examples, the memory dice may include non-volatile memory cells including a chalcogenide alloy. In some examples, a codeword or unit of data (e.g., 128 bytes) may be divided across the multiple memory dice within a memory media 195. In some examples, the controller 125 and the memory media 195 may be integrated with, in contact with, or placed on a board (e.g., a peripheral component interconnect express (PCIe) board).

Figure 2:
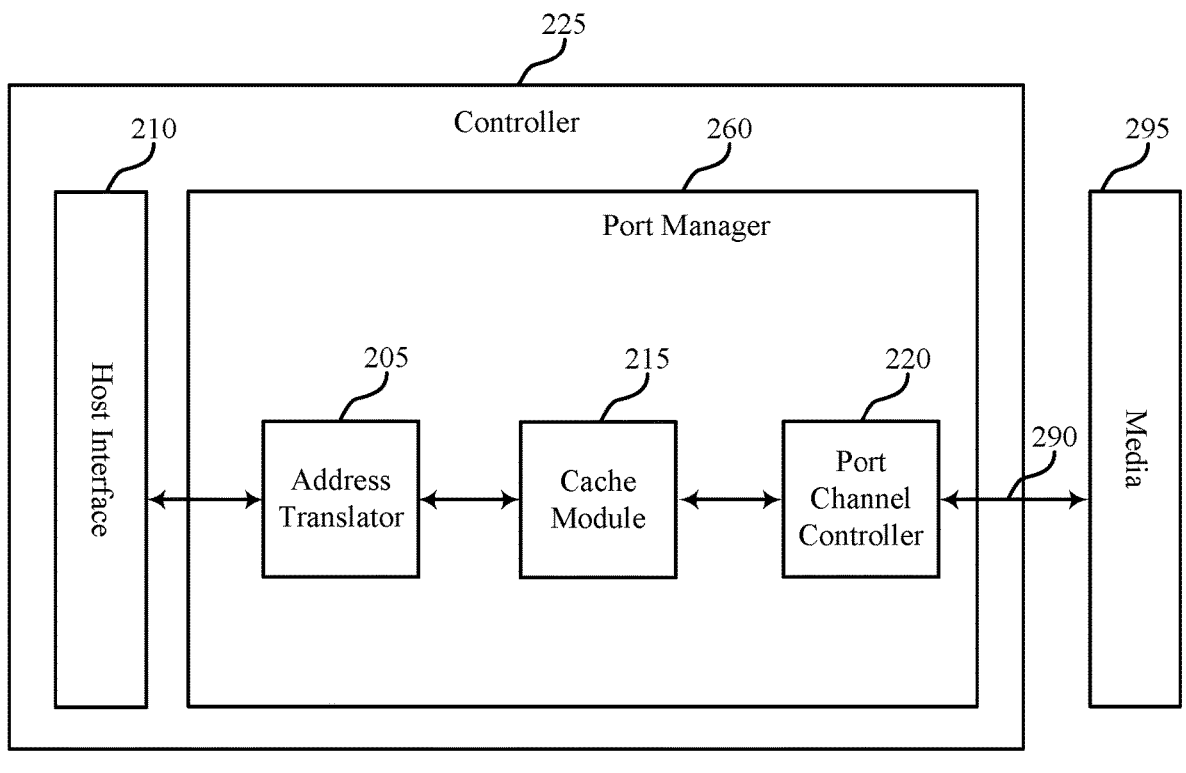
FIGS. 2 and 3 illustrate example memory subsystems that supports fully associative cache management in accordance with examples as disclosed herein.

FIG. 2 illustrates an example of a memory subsystem 200 that supports fully associative cache management in accordance with examples as disclosed herein. The memory subsystem 200 may be an example of the memory subsystem 120 as described with reference to FIG. 1. The memory subsystem 200 may include a controller 225 and media 295, which may be examples of the controller 125 and the media 195 as described with reference to FIG. 1, respectively. In some examples, the controller 225 may be or include an ASIC or programmable logic. The controller 225 may include one or more host interfaces 210 that may be coupled with a host device (not shown) using a host link that employs an interface protocol (e.g., the Gen-Z protocol, the CCIX protocol) as explained above. The memory subsystem 200 may also include an interconnect router (not shown) coupled between the host interface 210 and the port manager 260. The port manager 260 may be coupled with the media 295 using an aggregated channel 290, which may be an example of the aggregated channels 190 as described with reference to FIG. 1. The port manager 260 may further include an address translator 205, a cache module 215, and a port channel controller 220.

The host interface 210 may include physical layers for transmitting and receiving data through a host link coupled with a host device. The host interface 210 may receive a transaction-layer protocol packet through the host link and may decode the packet to extract an access command (e.g., indicating an access operation) from the host device as well as addresses and data associated with the access command. The host interface 210 may send the decoded information to the port manager 260 (e.g., by an interconnect router). Additionally or alternatively, the host interface 210 may generate a transactional-layer protocol packet and transmit the packet to the host device through the host link. That is, the host interface 210 may receive information (e.g., by the interconnect router) from the port manager 260 and communicate that information within the packet to the host device.

The port manager 260 may include an address translator 205. The address translator 205 may determine an address of the memory media 295 associated with each access operation. That is, the host device may communicate access commands indicating a logical address for performing an access operation. However, the interconnect router may interleave sequential logical addresses (e.g., known by the host device) across multiple memory media 295. In some cases, a codeword size associated with transactions at the host device is different than a codeword size associated with transactions at the media 295. As a result, a single media address may correspond to one or more logical addresses at the host device. The address translator 205 may further account for this codeword size mismatch (and corresponding difference in address space).

The port manager 260 may further include a cache module 215. The cache module 215 may increase performance of the memory subsystem 200. The cache module 215 may include a fully-associated write-back cache and associated content addressable memory (CAM). In some cases, the CAM may search its memory space when presented with an address associated with an access operation to see if data associated with the address is stored anywhere in the cache. For example, the CAM may enable the cache module 215 to determine whether data associated with an address of the memory media 295 is currently stored within the cache or not. If the content is within the cache, the port manager 260 may fetch the content from the cache (e.g., for a read), or write data to the cache (e.g., for a write) and thus avoiding additional latency of access to the memory media 295. Alternatively, if the content is not within the cache (e.g., a cache miss), the port manager 260 may determine to access the memory media 295 for a read operation, or store the data in the cache for a write operation. That is, in the case of a read operation, the port manager 260 may access the memory media 295 to fetch the content associated with the address presented. In the case of a write operation, the port manager 260 may determine to store the codeword included within the access command.

The port manager 260 may determine to store the content associated with the access operation within the cache module 215. In a case that the cache does not have any unused addresses, the cache module 215 may determine to evict data from an address within the cache. When determining which address of the cache to evict, the cache module 215 may refer to an address pointer indicating an address to evict. The cache module 215 may determine to evict either the address indicated by the address pointer or an address next to the address indicated by the pointer (based on an ordering of the cache addresses). The cache module 215 may determine which address to evict based on a quantity of accesses associated with each address. For example, if the address pointer indicates a first address associated with three (3) accesses and a second address (e.g., next to the first address according to the order indicated by the address pointer) is associated with one (1) access, the port manager 260 may determine to evict the contents of the second address.

The cache module 215 may facilitate shielding the memory media 295 from excessive transactions (e.g., read or write operations to memory cells) by distributing a quantity of read or writes on a memory media 295. In some cases, successive transactions to a same address location within the media 295 may result in an increase in raw bit error rates. For example, if the media 295 is a DRAM media 295, successive transactions may cause error rates associated with row hammering. In another example, if the media 295 is 3DXPoint or phase change memory, successive transactions may result in increased error rates due to thermal build-up. The cache module 215 may increase a minimum amount of time between successive transactions to a same address location within the media 295. That is, if a host device issues sequential access commands targeting a single address within the memory media 295, the memory subsystem 200 may access the cache repeatedly rather than the media 295. Additionally, a depth of the cache (e.g., a quantity of addresses within the cache) may dictate a minimum amount of time between accessing a same address location within the memory media 295. The depth of the cache may be configured to ensure that the minimum amount of time between accessing the same location within the memory media 295 exceeds a threshold.

In order to facilitate a transfer of data between the host device and the media 295, the cache module 215 may be configured to support codewords associated with the host device 105 and codewords associated with the media 295 (e.g., that may be different sizes). For example, each address within a cache may include an upper portion and a lower portion each configured to store a codeword associated with the host device (e.g., a 64 byte codeword). Additionally, the upper and lower portions may be configured to collectively store a codeword associated with the media 295 (e.g., a 128 byte codeword).

The port channel controller 220 determine which channel within the aggregated channel 290 to use for communicating data between the media 295 and the port manager 260.

Figure 3:
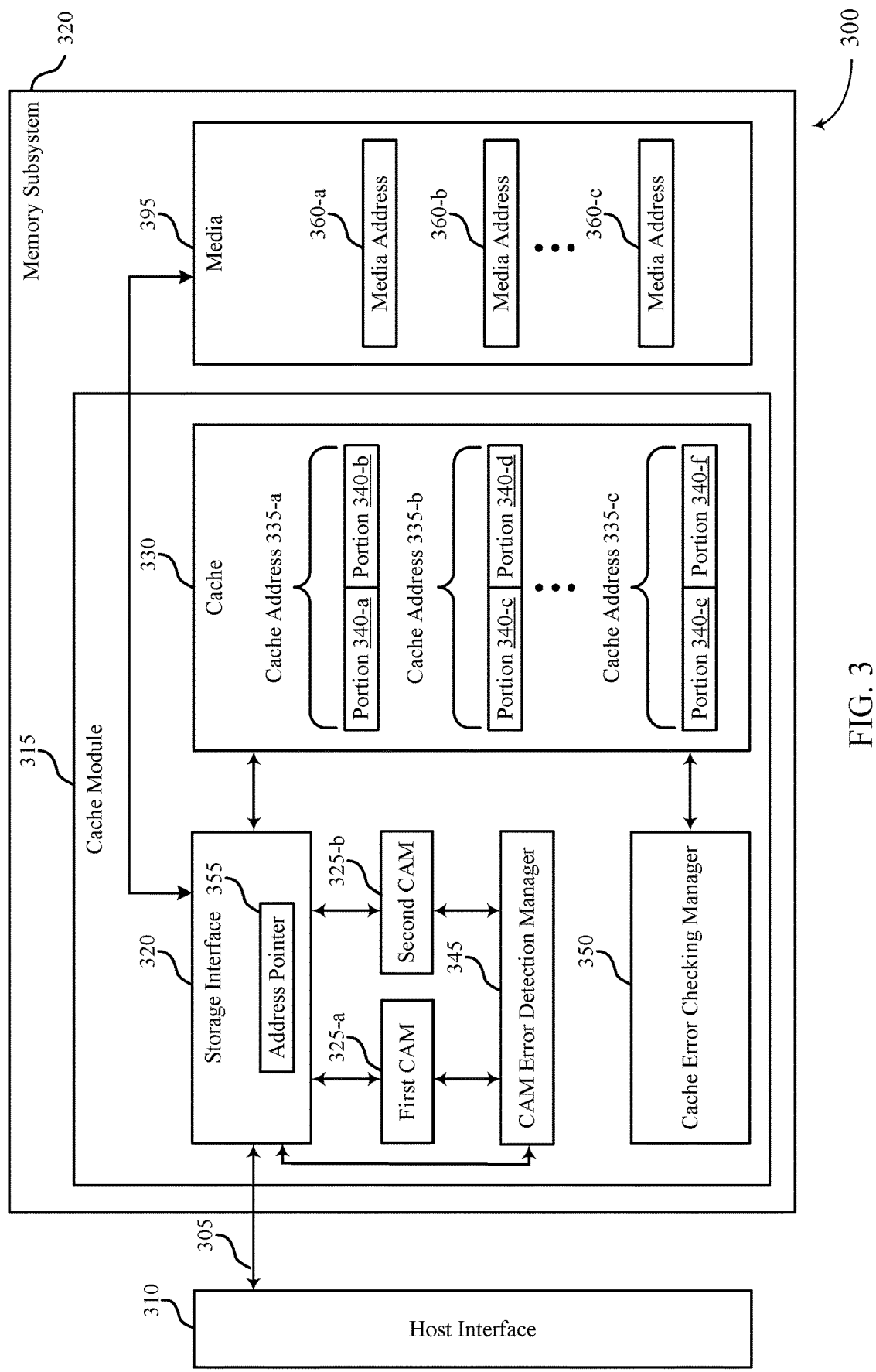

FIG. 3 illustrates an example of a memory subsystem 300 that supports fully associative cache management in accordance with examples as disclosed herein. The memory subsystem 300 may be an example of the memory subsystem 120 as described with reference to FIG. 1 or memory subsystem 200 as described with reference to FIG. 2. The memory subsystem 300 may include a host interface 310 and memory media 395, which may be an example of a host interface 110 or 210 and memory media 195 and 295, respectively, as described with reference to FIGS. 1 and 2. The memory subsystem 300 may further include a cache module 315, which may be an example of the cache module 215 as described with reference to FIG. 2. The cache module 315 may include a storage interface 320, CAMs 325, and a cache 330.

The host interface 310 may receive access commands from a host device (e.g., host device 105 as described with reference to FIG. 1). The access commands from the host device may include one or more logical addresses associated with an execution of the access command. The host interface 310 may communicate the access commands to one or more cache modules 315 via an interconnect router (e.g., interconnect router 140 as described with reference to FIG. 1). The interconnect router may distribute the access command for execution at one or more port managers and corresponding memory media 395. In some cases, prior to receiving the access commands at the cache module 315, the memory subsystem 300 may route the access commands through an address translator, such as the address translator 205 as described with reference to FIG. 2. The address translator may account for the interleaving (e.g., resulting from the interconnect router) and translate the logical address to a media address 360. In some cases, a codeword size associated with transactions at the host device is different than a codeword size associated with transactions at the media 395. As a result, a single media address 360 may correspond to one or more logical addresses at the host device. The address translator may further account for this codeword size mismatch.

The storage interface 320 may receive an access command 305 from the host interface 310 (e.g., via the interconnect router and the address translator). The access command 305 may include an indication of a media address 360 and, in some cases, data to be stored at the media address 360 (e.g., in the case that the access command 305 indicates a write operation). The storage interface 320 may communicate the media address 360 to the first and second CAMs 325. The CAMs 325 may indicate, to the storage interface 320, whether data corresponding to the media address 360 is stored within the cache 330. The cache 330 may be a memory component (e.g., a static random access memory (SRAM)) configured to store a portion of the data that is stored or is to be stored at the media 395. In some cases, access operations performed at the cache 330 (e.g., as opposed to the media 395) may experience less latency and may protect the media 395 from excessive access operations, thus increasing a reliability of the media 395.

The cache 330 may include a certain quantity of cache addresses 335 (e.g., 20,480) each including more than one portion of data 340. The cache 330 may be fully-associative. That is, each of the cache addresses 335 may store data associated with any of the media addresses 360 of the media 395. Each cache address 335 may be configured to store a certain quantity of bits. The quantity of bits may be grouped into various fields. For example, each cache address 335 may include one or more of a codeword data field (e.g., including a codeword of data), an error correction field (e.g., error correction information generated based on each of the bits within a portion 340 or error correction information generated based on each of the bits stored within the cache address 335-a), a hit count field (e.g., indicating a quantity of times the codeword associated with the portion of data 340 has been accessed), a valid field (e.g., indicating whether the data stored within the cache address 335 corresponds to data stored at a media address 360), a dirty field (e.g., indicating whether the data stored at the cache address 335 corresponds to data stored at a media address 360 but has been updated from the data stored at the media address 360), and a poison field (e.g., indicating whether the data stored at the cache address 335 is corrupted due to, for example, a quantity of errors within the data exceeding a threshold). In some cases, each portion 340 may include the data field. For example, each portion 340 may include a codeword data field, a valid field, a dirty field, and a poison field. Additionally or alternatively, the cache address 335 may include data fields common to each of the portions 340 within the cache address. For example, the cache address 335-c may have a hit count field that is shared by both portions 340-e and 340-f.

In one example, each of the cache addresses 335 may include 1054 bits (although one skilled in the art would understand that this quantity is given by example and different implementations may use different quantities of bits). In one example of a cache address 335 configured to store 1054 bits of information, cache address 335-b may include a two (2) bit hit count field common to both portions of data 340-c and 340-d. Each of the portions of data 340-c and 340-d may include a 512 bit codeword data field, a one (1) bit valid field, a one (1) bit dirty field, a one (1) bit poison field, and an eleven (11) bit error correction field.

Each portion 340 may store codewords of a same size as a codeword size of the host device. For example, access operations received by the storage interface 320 may indicate data transactions of codewords of the first size. The codeword size of data stored at each media address 360 may be different than the codeword size of data stored within the portions of data 340. For example, while each portion of data 340 may include a 64 byte codeword, each media address 360 may store a 128 byte codeword. In some cases, the collective contents of a cache address 335 may correspond to a codeword within a media address 360. For example, portion 340-a of cache address 335-a may include an upper 64 bytes of the 128 byte codeword stored at the media address 360-a while the portion 340-b of the cache address 335-a includes a lower 64 bytes of the 128 byte codeword stored at the media address 360-b.

The CAMs 325 may include entries indicating an address of the media 395 associated with each address in the cache 330. For example, a first entry in the CAMs 325 may correspond to cache address 335-a. The first entries may indicate a media address 360 (e.g., media address 360-c) associated with the data in the cache address 335-a. If a cache address 335 is invalid (e.g., does not include valid data associated with a media address 360, the CAM 325 may include an entry with all bits set to a logic value '1.' In some cases, the CAMs 325 may include entries that are a same size as the media addresses 360. For example, if each media address 360 is addressable by 34 bytes, each CAM entry may also be 34 bytes.

The first CAM 325-a and the second CAM 325-b may act as duplicate CAMs 325. That is, the CAMs 325 may be configured to each store a same set of entries and may be used to detect and correct errors that may occur in the other CAM 325. For example, if the storage interface 320 indicates media address 360-a to the first CAM 325-a and the second CAM 325-b and both CAMs 325 report a same cache address 335-a to the CAM error detection manager 345, the CAM error detection manager 345 may determine that there are no errors in either of the CAMs 325 at the entry associated with the cache address 335-*a*. Alternatively, if one CAM 325 indicates the cache 330 does not include data associated with the media address 360 while the other CAM 325 indicates that the cache 330 does include data associated with the media address 360, the CAM error detection manager 345 may determine that there is an error associated with the corresponding cache entry in one of the CAMs 325. In another example, if each of the CAMs 325 indicate different cache addresses 335 associated with the media address 360, the CAM error detection manager 345 may determine that there is an error associated with at least one of the corresponding cache entries in the CAMs 325.

To determine which CAM 325 contains an error, the CAM error detection manager 345 may deliver the one or more cache addresses 335 received from the CAMs 325 to the storage interface 320. The storage interface 320 may fetch the data from the indicated cache address 335 and communicate the data to the CAM error detection manager 345. Each of the portions of data 340 stored at a cache address 335 may include error correction information. Performing an error detection operation (e.g., a single error correction double error detection (SECDED) operation) on each of the portions of the data stored at the cache address 335 may indicate whether the data stored at the cache address 335 is associated with the media address 360. Based on determining an error in one of the CAMs 325 by performing the error detection operation, the CAM error detection manager 345 may correct the detected errors within the CAM 325.

During the execution of a read command, the storage interface 320 may receive an indication of a cache address 335 associated with the media address 360, read the contents of the indicated cache address 335, and communicate the data to the host interface 310 (e.g., to be communicated to the host device). During the execution of a write command, the storage interface 320 may write data associated with the access command to the cache address 335. In either example, the access command may result in accessing the cache 330 rather than accessing the media 395, which may protect the media 395 from excessive access operations. Upon performing the indicated access operation associated with the cache address 335, the storage interface 320 may update a hit count field associated with the cache address 335 (and stored at the cache address 335 within a hit count field). In some cases, the hit count field may be a two (2) bit field stored at each cache address 335. When data is initially written to the cache address 335, the hit count field may be set to zero (e.g., each of the bits within the hit count field are a logic value '0'). Each time the cache address 335 is accessed, the storage interface 320 may update the hit count field by one (1), saturating when each of the bits within the hit count field is a logic value '1'. Here, if the cache address 335 is accessed, the storage interface 320 may leave the hit count field as all logic value '1s,' indicating a maximum quantity of hits (e.g., three (3)) able to be represented by the hit count field.

When the storage interface 320 receives an indication that the cache 330 does not include data associated with the indicated media address 360, the storage interface 320 may determine a cache address 335 to evict in order to store the data associated with the indicated media address 360. The storage interface 320 may determine to evict data associated with the address pointer 355. The address pointer 355 may be a pointer that cycles through each of the cache addresses 335 according to an order. For example, the address pointer 355 may be initialized to point to a first cache address 335-*a*. Incrementing the address pointer 355 by a value of one (1) may cause the address pointer 355 to point to a next cache address 335-*b*. Incrementing the address pointer 355 by a value of one (1) when the address pointer 355 is pointing to a last cache address 335-*c* may cause the address pointer 355 to be reset to point to the first cache address 335-*a*.

If the address pointer 355 is pointing to a cache address 335 with a hit count value less than or equal to a threshold value (e.g., one (1) hit), the storage interface 320 may determine to evict the contents of the cache address 335. Additionally or alternatively, if the storage interface 320 determines that the hit count value of the cache address 335 exceeds the threshold value, the storage interface 320 may determine a hit count value associated with the next cache address 335 (e.g., according to the order of cache addresses 335 indicated by the address pointer 355). For example, if the address pointer 355 is pointing to the cache address 335-*a* which has a hit count value of zero (0), the storage interface 320 may determine to evict the contents of the cache address 335-*a*. But if the cache address 335-*a* has a hit count value of three (3), the storage interface 320 may determine the hit count value of cache address 335-*b*. If the hit count value of the next cache address 335 is less than the hit count value of the first cache address 335, the storage interface 320 may evict the contents of the next cache address 335. Alternatively, if the hit count value of the next cache address 335 is equal to or greater than the hit count value of the first cache address 335, the storage interface 320 may evict the contents of the first cache address 335 or continue to determine the hit count value of sequential cache addresses 335. For example, the storage interface may determine the hit count value of sequential cache addresses up to a maximum number hit count values (e.g., two (2), three (3), four (4)). In the case that the one of the sequential cache addresses 335 has a hit count value lower than the threshold hit count value, the storage interface 320 may evict the contents of that cache address 335. Alternatively, the storage interface 320 may determine each of the sequential hit count values (e.g., the maximum number of hit count values associated with each sequential cache address 335) and evict the contents of the sequential cache addresses 335 with a lowest hit count value.

Depending on which cache address 335 is evicted, the storage interface 320 may update the address pointer 355. For example, if the storage interface 320 evicts the contents of the cache address 335 indicated by the address pointer 355, the storage interface 320 may increment the address pointer 355 by one (1) to point to the next cache address 335. Additionally or alternatively, if the storage interface 320 evicts the contents of a sequential cache address, the storage interface 320 may update the address pointer 355 to point to a cache address 335 sequential to the evicted cache address 335.

When the storage interface 320 evicts data from a cache address 335, the storage interface 320 first determines what to do with the data within the cache address 335. That is, the storage interface 320 may determine whether a codeword stored in either portion of data 340 is valid or invalid, dirty or clean, or poison. If a codeword is invalid, valid and clean, or poison, the storage interface 320 may discard the contents of the cache address 335. However, if the codeword is valid and dirty, the storage interface may update the codeword stored in the corresponding media address 360 prior to evicting the data from the cache address.

When the storage interface 320 writes a new codeword of a first size to a portion of data 340 of a cache address 335, the storage interface 320 may also updated the corresponding entry in both the first CAM 325-*a* and the second CAM 325-b. In one example, if an upper portion of data 340-e and a lower portion of data 340-f of a cache address 335-c are both valid and not dirty (e.g., both corresponding to a same media address 360) and a codeword of a first size is written to the upper portion 340-e of the cache address 335-c after evicting the data from the cache address, the data within the lower portion 340-f of the cache address 335-c is now invalid. That is, the cache address 335-c is now associated with a different media address 360 than the contents of the lower portion of data 340-f. In some other cases, the storage interface 320 may automatically populate each cache address 335 with codewords in each portion of data 340 that are associated with a same media address 360. That is, in the case the upper portion of data 340-e of the cache address 335-c is associated with the media address 360-b, the storage interface 320 may write the rest of the codeword stored at the media address 360-b to the lower portion of data 340-f. Here, both portions of data 340-e and 340-f may be valid.

In some cases, the CAM error detection manager 345 and the cache error checking manager 350 may perform periodic ECC scrub operations on the CAMs 325 and the cache 330, respectively. The ECC scrub operation on the CAMs 325 may include the CAM error detection manager 345 reading all of the contents of each of the CAMs 325, comparing each entry, performing an error detection operation in a case that the entries to not match, and correcting one or more errors as a result. The ECC scrub operation on the cache 330 may include the cache error checking manager 350 reading the contents of each cache address 335 from the cache, performing an error detection operation on both portions of data 340 stored within each cache address, and writing the contents of the cache address 335 back to the cache. In some cases, the periodicity of the ECC scrub operation may be significantly less often than a periodicity of reading the contents of a cache address 335, thus making the latency introduced by the ECC scrub operation less significant. For example, if a cache address 335 is read one billion times a second, and the contents of each cache address 335 are scrubbed every 0.1 second, less than 0.03% of a read capability of the cache module 315 is utilized for performing the ECC scrub operation.

Figure 4:
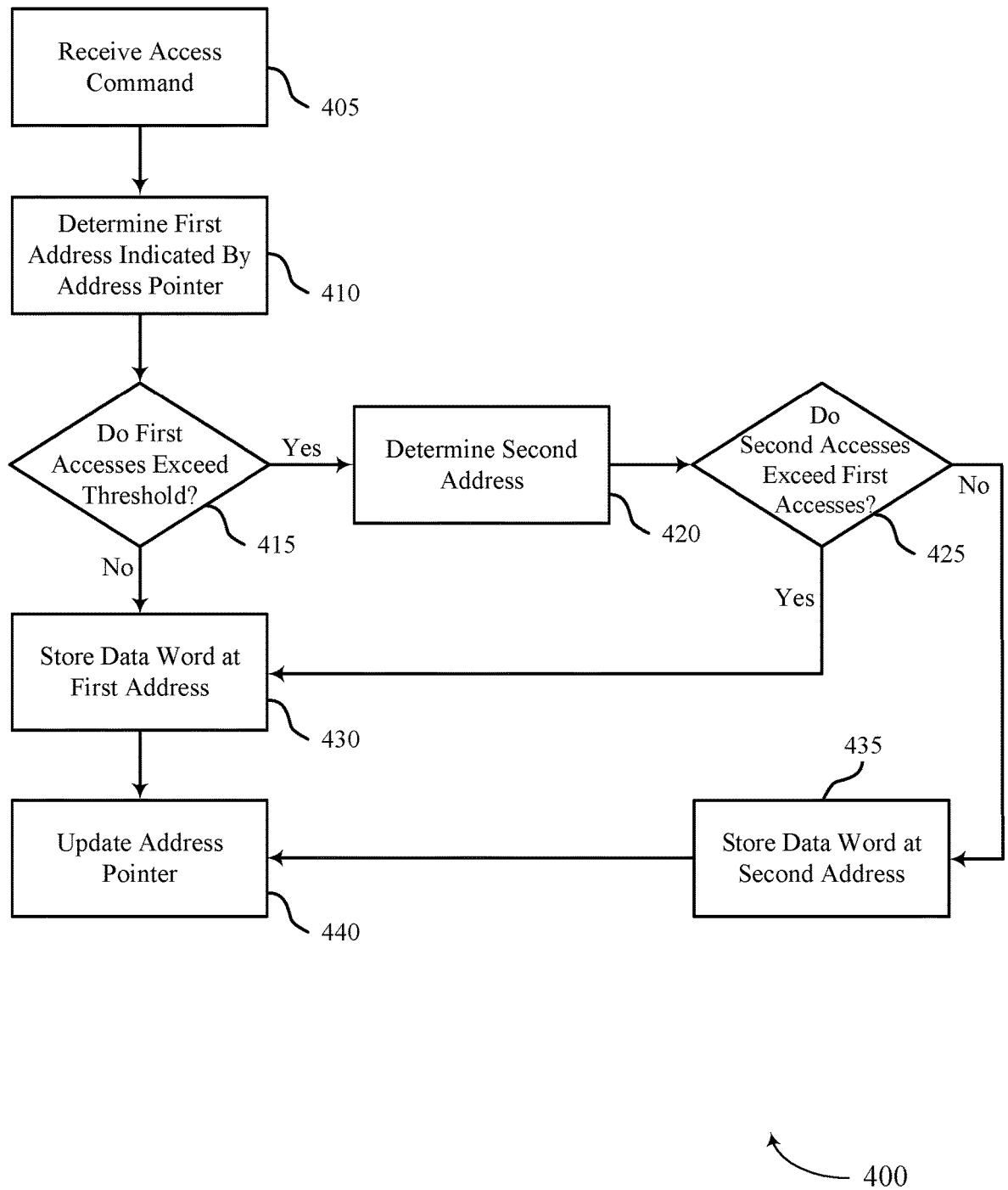
FIG. 4 illustrates an example of a process flow that supports fully associative cache management in accordance with examples as disclosed herein.

FIG. 4 illustrates an example of a process flow 400 that supports fully associative cache management in accordance with examples as disclosed herein. The process flow 400 may include operations performed by devices or components as described with reference to FIGS. 1-3. For example, the process flow 400 may include operations performed by a controller 125 or 225 or a port manager 160 or 260 as described with reference to FIGS. 1 and 2. Additionally or alternatively, the process flow 400 may include operations performed by a cache module 215 or 315 as described with reference to FIGS. 2 and 3.

At 405, a device may receive an access command (e.g., a write command). The access command may indicate a media address associated with the access command as well as a first data word (e.g., a codeword). After receiving the access command, the device may execute the operations described at 410.

At 410, the device may determine a cache address indicated by an address pointer (e.g., address pointer 355 as described with reference to FIG. 3). For example, the device may determine to evict data from an address of the cache (e.g., based on a cache miss indicated by a CAM associated with the cache) and, based on determining to evict data from an address of the cache, determine which cache address is indicated by the address pointer. After determining the cache address indicated by the address pointer, the device may execute the operations described at 415.

At 415, the device may determine whether a quantity of accesses associated with the determined address of the cache (e.g., a first address of the cache) exceeds a threshold (e.g., zero (0) accesses, one (1) access, two (2) accesses). For example, the data stored at the address of the cache may include a hit count field indicating a number of accesses associated with the data stored at the cache address. If the quantity of accesses associated with the determined address of the cache does not exceed the threshold, the device may execute operations described at 430. Alternatively, if the quantity of accesses does exceed the threshold, the device may execute operations described at 420.

At 420, the device may determine a set of one or more second addresses. The set of second addresses may include one or more cache addresses that are sequential to the first address according to an order of addresses of the cache (e.g., indicated by the address pointer). After determining the set of second addresses, the device may execute operations described at 425.

At 425, the device may determine whether a second quantity of accesses associated with one of cache addresses within the second set of addresses exceeds the first quantity of accesses associated with the first address of the cache (e.g., indicated by the address pointer). In one example, the device may compare the quantity of accesses of each of the second set of addresses to the first quantity of accesses. If each of the quantity of accesses associated with one of the second set of addresses exceeds the first quantity of accesses, the device may execute operations described at 430. Alternatively, if any of the quantity of accesses associated one of the second set of addresses does not exceed the first quantity of accesses, the device may determine which of the second set of addresses is associated with a smallest quantity of accesses and execute operations described at 435.

At 430, the device may store the first data word at the first address indicated by the address pointer. After storing the first data word at the first address, the device may execute operations described at 440.

At 435, the device may store the first data word at one of the set of second addresses sequential to the first address. For example, the device may store the first data word at the address within the set of second addresses associated with a smallest quantity of accesses. After storing the first data word at one of the second addresses, the device may execute operations described at 440.

At 440, the device may update the address pointer based on storing the data word. In a case that the device stores the data word at the first address, the device may update the address pointer by incrementing the address pointer to point to the next sequential address. In a case that the device stores the data word at the second address, the device may update the address pointer by incrementing the address pointer to point to the next sequential address after the second address.

Figure 5:
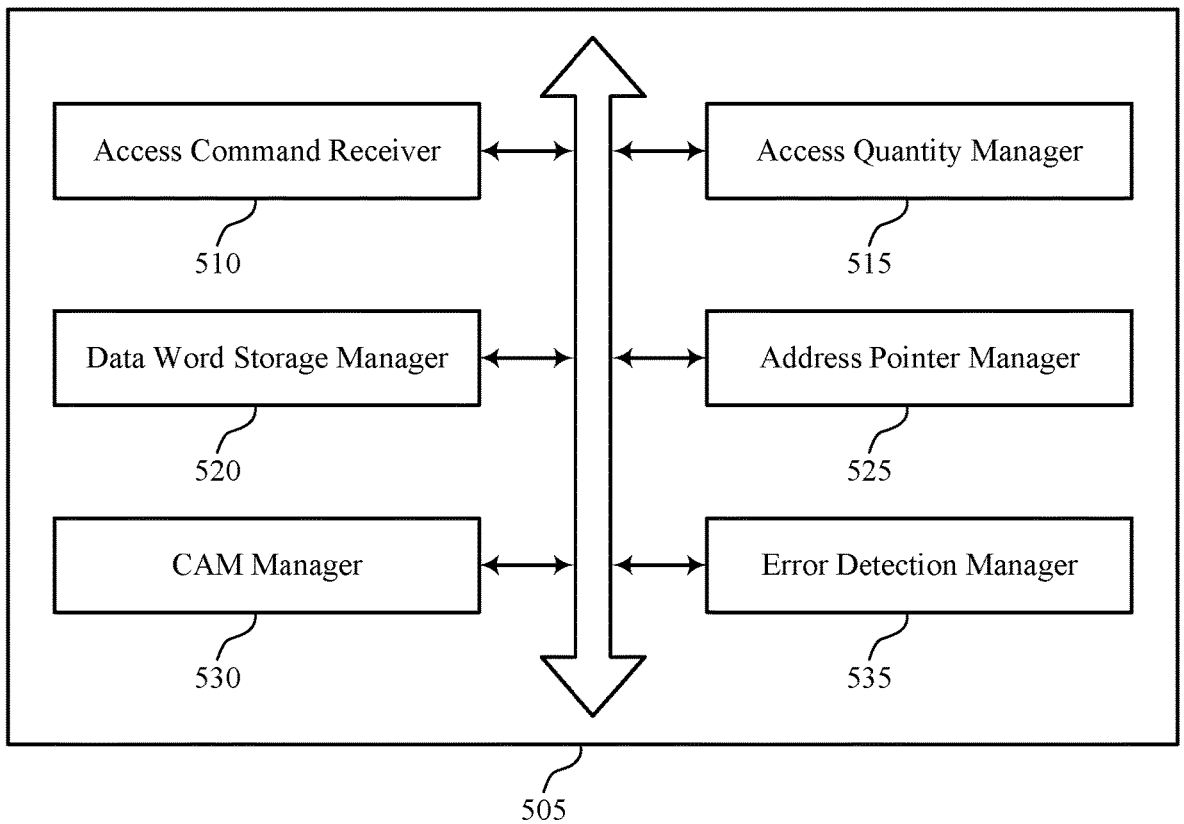
FIG. 5 shows a block diagram of a memory device that supports fully associative cache management in accordance with aspects of the present disclosure.

FIG. 5 shows a block diagram 500 of a memory device 505 that supports fully associative cache management in accordance with examples as disclosed herein. The memory device 505 may be an example of or include aspects of a memory subsystem. The memory device 505 may include an access command receiver 510, an access quantity manager 515, a data word storage manager 520, an address pointer manager 525, a CAM manager 530, and an error detection manager 535. Each of these modules may communicate, directly or indirectly, with one another (e.g., via one or more buses).

The access command receiver 510 may receive a first access command including a first data word for storage in a storage component associated with an address space. In some examples, the access command receiver 510 may receive an access command indicating an access operation associated with the first data word at the second address within the cache. In some instances, the access command receiver 510 may receive, from a host device, a second access command including a third data word for storing in the storage component.

The access quantity manager 515 may determine, based on receiving the first access command, a quantity of accesses associated with a second data word stored at a first address of a cache indicated by an address pointer, where each address of the cache is operable to store a data word associated with a range of addresses spanning the address space. In some cases, a size of the cache may be based on a minimum time from executing a first write operation at a location of the storage component and a second write operation at the location of the storage component. In some examples, the access quantity manager 515 may update a quantity of accesses associated with the first data word based on the receiving the access command.

In some examples, the access quantity manager 515 may determine that the second address is the same as the first address based on determining that the quantity of accesses associated with the second data is less than a threshold quantity of accesses, where updating the address pointer is based on determining that the second address is the same as the first address.

In some cases, the access quantity manager 515 may determine that the quantity of accesses associated with the second data word is greater than a threshold quantity of accesses. Here, the access quantity manager 515 may compare a second quantity of accesses associated with a third data word stored at a third address of the cache different than the first address of the cache to the quantity of accesses based on the determining that the quantity of accesses is greater than the threshold quantity of accesses, where the third address is sequential to the first address according to an order of addresses of the cache.

In some examples, the access quantity manager 515 may determine, based on the comparing, that the second quantity of accesses is greater than the quantity of accesses. Here, the access quantity manager 515 may determine that the second address is the same as the first address based on determining that the second quantity of accesses is greater than the quantity of accesses. In some other examples, the access quantity manager 515 may determine, based on the comparing, that the second quantity of accesses is less than the quantity of accesses. Here, the access quantity manager 515 may determine that the second address is the same as the third address based on determining that the second quantity of accesses is less than the quantity of accesses.

The data word storage manager 520 may store the first data word at a second address within the cache based on the first address indicated by the address pointer and the quantity of accesses associated with the second data word. In some examples, the data word storage manager 520 may determine whether to store the third data word at the third address of the cache based on the error detection procedure. In some cases, the data word storage manager 520 may determine whether to store the third data word at the third address or the fourth address of the cache based on the first error detection procedure and the second error detection procedure.

The address pointer manager 525 may update the address pointer based on the second address. In some examples, the address pointer manager 525 may update the address pointer based on the relationship between the first address and the second address. In some other examples, the address pointer manager 525 may determine that the updated address pointer indicates an address outside of the cache. In some instances, the address pointer manager 525 may set the address pointer to indicate a lowest address of the cache in an order of addresses of the cache, where the updating the address pointer is based on the setting the address pointer.

In some examples, the address pointer manager 525 may update the address pointer to indicate a third address of the cache sequential to the first address of the cache according to an order of addresses of the cache based on the first address and the second address being the same. In some cases, the address pointer manager 525 may update the address pointer to indicate a third address of the cache sequential to the second address of the cache according to the order of addresses based on the second address being sequential to the first address.

The CAM manager 530 may search a first CAM and a second CAM for an address of the storage component associated with the third data word based on the receiving the second access command. In some examples, determining the first CAM includes a first entry associating a third address of the cache with the address of the storage component based on the searching the first CAM. In some instances, the CAM manager 530 may determine a cache miss for the third address for the second CAM. In some cases, determining the first CAM includes a first entry associating a third address of the cache with the address of the storage component based on the searching the first CAM. In some examples, determining the second CAM includes a second entry associating a fourth address of the cache with the address of the storage component based on the searching the second CAM.

The error detection manager 535 may perform an error detection procedure on a fourth data word stored at the third address of the cache according to error correction information generated based on the fourth data word and the first CAM. In some examples, the error detection manager 535 may perform a first error detection procedure on a fourth data word stored at the third address of the cache according to error correction information generated based on the fourth data word and the first CAM. In some cases, the error detection manager 535 may perform a second error detection procedure on a fifth data word stored at the fourth address of the cache according to error correction information generated based on the fifth data word and the second CAM.

Figure 6:
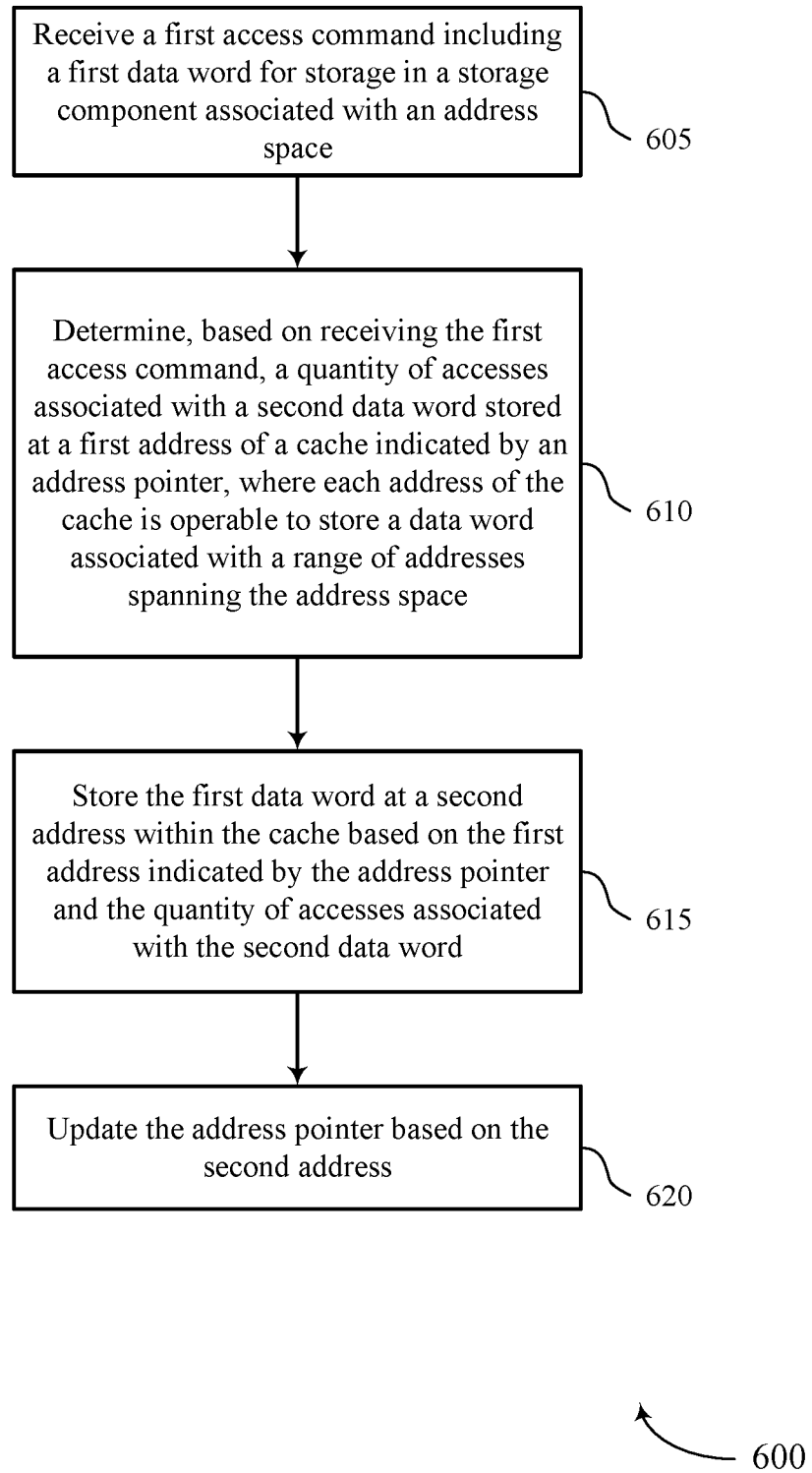
FIGS. 6 through 8 show flowcharts illustrating a method or methods that support fully associative cache management in accordance with examples as disclosed herein.

FIG. 6 shows a flowchart illustrating a method or methods 600 that supports fully associative cache management in accordance with aspects of the present disclosure. The operations of method 600 may be implemented by a memory device or its components as described herein. For example, the operations of method 600 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 605, the memory device may receive a first access command including a first data word for storage in a storage component associated with an address space. The operations of 605 may be performed according to the methods described herein. In some examples, aspects of the operations of 605 may be performed by an access command receiver as described with reference to FIG. 5.

At 610, the memory device may determine, based on receiving the first access command, a quantity of accesses associated with a second data word stored at a first address of a cache indicated by an address pointer, where each address of the cache is operable to store a data word associated with a range of addresses spanning the address space. The operations of 610 may be performed according to the methods described herein. In some examples, aspects of the operations of 610 may be performed by an access quantity manager as described with reference to FIG. 5.

At 615, the memory device may store the first data word at a second address within the cache based on the first address indicated by the address pointer and the quantity of accesses associated with the second data word. The operations of 615 may be performed according to the methods described herein. In some examples, aspects of the operations of 615 may be performed by a data word storage manager as described with reference to FIG. 5.

At 620, the memory device may update the address pointer based on the second address. The operations of 620 may be performed according to the methods described herein. In some examples, aspects of the operations of 620 may be performed by an address pointer manager as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for receiving a first access command including a first data word for storage in a storage component associated with an address space, determining, based on receiving the first access command, a quantity of accesses associated with a second data word stored at a first address of a cache indicated by an address pointer, where each address of the cache is operable to store a data word associated with a range of addresses spanning the address space, storing the first data word at a second address within the cache based on the first address indicated by the address pointer and the quantity of accesses associated with the second data word, and updating the address pointer based on the second address.

Some examples of the method 600 and the apparatus described herein may further include operations, features, means, or instructions for determining that the second address may be the same as the first address based on determining that the quantity of accesses associated with the second data may be less than a threshold quantity of accesses, where updating the address pointer may be based on determining that the second address may be the same as the first address.

Some cases of the method 600 and the apparatus described herein may further include operations, features, means, or instructions for determining that the quantity of accesses associated with the second data word may be greater than a threshold quantity of accesses, and comparing a second quantity of accesses associated with a third data word stored at a third address of the cache different than the first address of the cache to the quantity of accesses based on the determining that the quantity of accesses may be greater than the threshold quantity of accesses, where the third address may be sequential to the first address according to an order of addresses of the cache.

Some instances of the method 600 and the apparatus described herein may further include operations, features, means, or instructions for determining, based on the comparing, that the second quantity of accesses may be greater than the quantity of accesses, and determining that the second address may be the same as the first address based on determining that the second quantity of accesses may be greater than the quantity of accesses.

Some examples of the method 600 and the apparatus described herein may further include operations, features, means, or instructions for determining, based on the comparing, that the second quantity of accesses may be less than the quantity of accesses, and determining that the second address may be the same as the third address based on determining that the second quantity of accesses may be less than the quantity of accesses.

Some cases of the method 600 and the apparatus described herein may further include operations, features, means, or instructions for receiving an access command indicating an access operation associated with the first data word at the second address within the cache, and updating a quantity of accesses associated with the first data word based on the receiving the access command.

Some instances of the method 600 and the apparatus described herein may further include operations, features, means, or instructions for updating the address pointer based on the relationship between the first address and the second address, determining that the updated address pointer indicates an address outside of the cache, and setting the address pointer to indicate a lowest address of the cache in an order of addresses of the cache, where the updating the address pointer may be based on the setting the address pointer.

Some examples of the method 600 and the apparatus described herein may further include operations, features, means, or instructions for updating the address pointer to indicate a third address of the cache sequential to the first address of the cache according to an order of addresses of the cache based on the first address and the second address being the same.

Some cases of the method 600 and the apparatus described herein may further include operations, features, means, or instructions for updating the address pointer to indicate a third address of the cache sequential to the second address of the cache according to the order of addresses based on the second address being sequential to the first address.

Some instances of the method 600 and the apparatus described herein may further include operations, features, means, or instructions for receiving, from a host device, a second access command including a third data word for storing in the storage component, and searching a first CAM and a second CAM for an address of the storage component associated with the third data word based on the receiving the second access command.

Some examples of the method 600 and the apparatus described herein may further include operations, features, means, or instructions for determining the first CAM includes a first entry associating a third address of the cache with the address of the storage component based on the searching the first CAM, determining a cache miss for the third address for the second CAM, performing an error detection procedure on a fourth data word stored at the third address of the cache according to error correction information generated based on the fourth data word and the first CAM, and determining whether to store the third data word at the third address of the cache based on the error detection procedure.

Some cases of the method 600 and the apparatus described herein may further include operations, features, means, or instructions for determining the first CAM includes a first entry associating a third address of the cache with the address of the storage component based on the searching the first CAM, determining the second CAM includes a second entry associating a fourth address of the cache with the address of the storage component based on the searching the second CAM, performing a first error detection procedure on a fourth data word stored at the third address of the cache according to error correction information generated based on the fourth data word and the first CAM, performing a second error detection procedure on a fifth data word stored at the fourth address of the cache according to error correction information generated based on the fifth data word and the second CAM, and determining whether to store the third data word at the third address or the fourth address of the cache based on the first error detection procedure and the second error detection procedure.

In some instances of the method 600 and the apparatus described herein, a size of the cache may be based on a minimum time from executing a first write operation at a location of the storage component and a second write operation at the location of the storage component.

Figure 7:
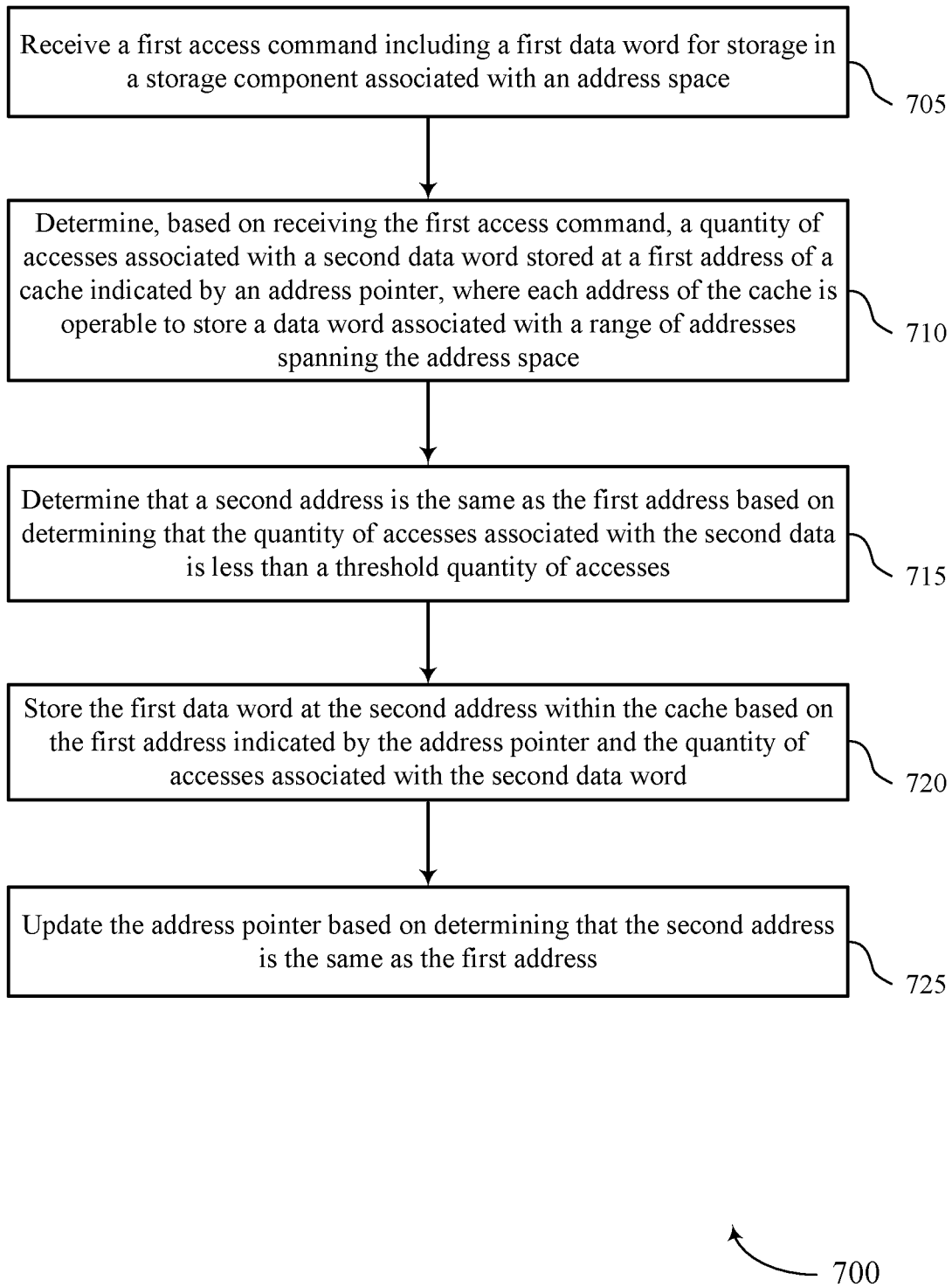

FIG. 7 shows a flowchart illustrating a method or methods 700 that supports fully associative cache management in accordance with aspects of the present disclosure. The operations of method 700 may be implemented by a memory device or its components as described herein. For example, the operations of method 700 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 705, the memory device may receive a first access command including a first data word for storage in a storage component associated with an address space. The operations of 705 may be performed according to the methods described herein. In some examples, aspects of the operations of 705 may be performed by an access command receiver as described with reference to FIG. 5.

At 710, the memory device may determine, based on receiving the first access command, a quantity of accesses associated with a second data word stored at a first address of a cache indicated by an address pointer, where each address of the cache is operable to store a data word associated with a range of addresses spanning the address space. The operations of 710 may be performed according to the methods described herein. In some examples, aspects of the operations of 710 may be performed by an access quantity manager as described with reference to FIG. 5.

At 715, the memory device may determine that a second address is the same as the first address based on determining that the quantity of accesses associated with the second data is less than a threshold quantity of accesses. The operations of 715 may be performed according to the methods described herein. In some examples, aspects of the operations of 715 may be performed by an access quantity manager as described with reference to FIG. 5.

At 720, the memory device may store the first data word at the second address within the cache based on the first address indicated by the address pointer and the quantity of accesses associated with the second data word. The operations of 720 may be performed according to the methods described herein. In some examples, aspects of the operations of 720 may be performed by a data word storage manager as described with reference to FIG. 5.

At 725, the memory device may update the address pointer based on the second address based on determining that the second address is the same as the first address. The operations of 725 may be performed according to the methods described herein. In some examples, aspects of the operations of 725 may be performed by an address pointer manager as described with reference to FIG. 5.

Figure 8:
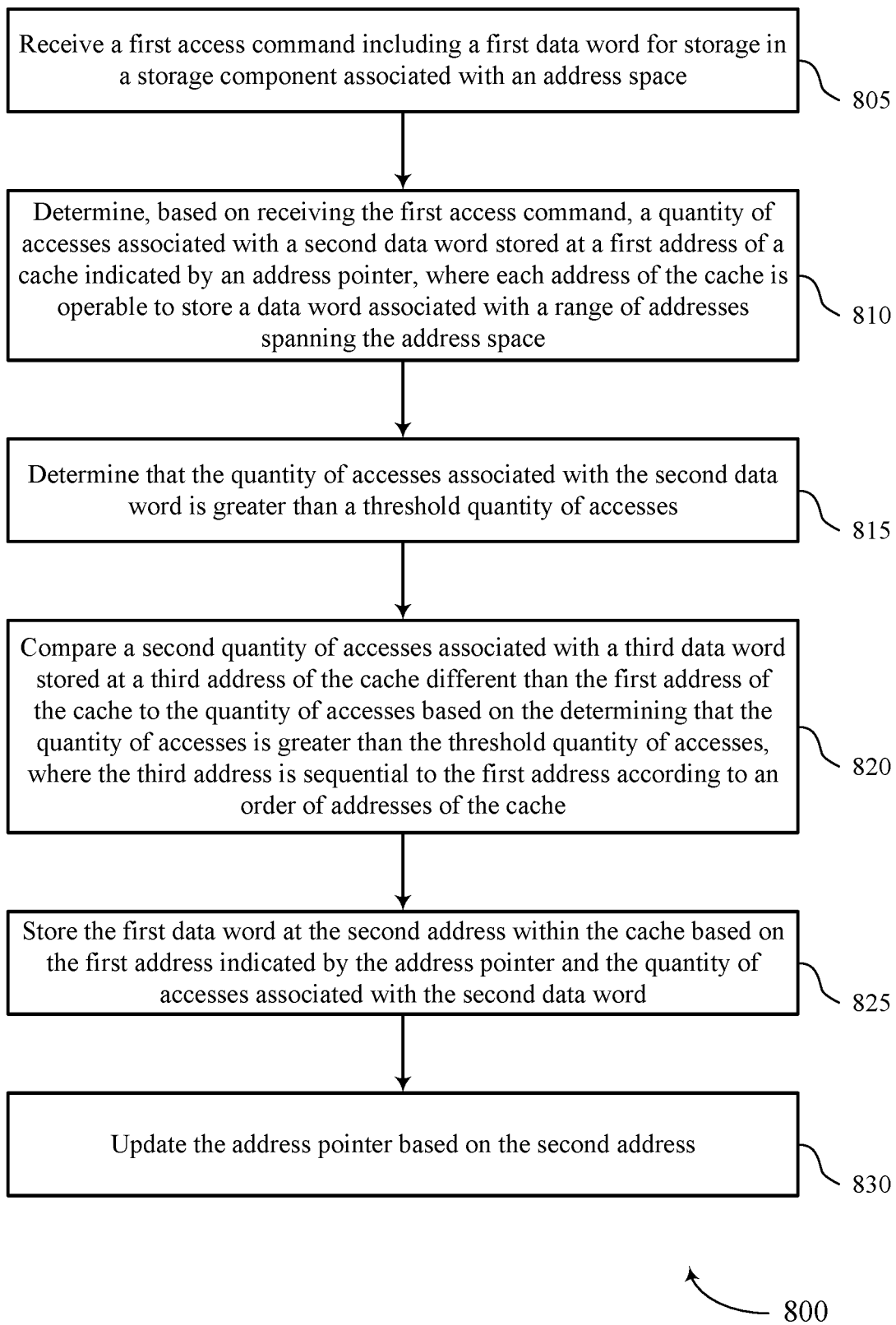

FIG. 8 shows a flowchart illustrating a method or methods 800 that supports fully associative cache management in accordance with aspects of the present disclosure. The operations of method 800 may be implemented by a memory device or its components as described herein. For example, the operations of method 800 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 805, the memory device may receive a first access command including a first data word for storage in a storage component associated with an address space. The operations of 805 may be performed according to the methods described herein. In some examples, aspects of the operations of 805 may be performed by an access command receiver as described with reference to FIG. 5.

At 810, the memory device may determine, based on receiving the first access command, a quantity of accesses associated with a second data word stored at a first address of a cache indicated by an address pointer, where each address of the cache is operable to store a data word associated with a range of addresses spanning the address space. The operations of 810 may be performed according to the methods described herein. In some examples, aspects of the operations of 810 may be performed by an access quantity manager as described with reference to FIG. 5.

At 815, the memory device may determine that the quantity of accesses associated with the second data word is greater than a threshold quantity of accesses. The operations of 815 may be performed according to the methods described herein. In some examples, aspects of the operations of 815 may be performed by an access quantity manager as described with reference to FIG. 5.

At 820, the memory device may compare a second quantity of accesses associated with a third data word stored at a third address of the cache different than the first address of the cache to the quantity of accesses based on the determining that the quantity of accesses is greater than the threshold quantity of accesses, where the third address is sequential to the first address according to an order of addresses of the cache. The operations of 820 may be performed according to the methods described herein. In some examples, aspects of the operations of 820 may be performed by an access quantity manager as described with reference to FIG. 5.

At 825, the memory device may store the first data word at a second address within the cache based on the first address indicated by the address pointer and the quantity of accesses associated with the second data word. The operations of 825 may be performed according to the methods described herein. In some examples, aspects of the operations of 825 may be performed by a data word storage manager as described with reference to FIG. 5.

At 830, the memory device may update the address pointer based on the second address. The operations of 830 may be performed according to the methods described herein. In some examples, aspects of the operations of 830 may be performed by an address pointer manager as described with reference to FIG. 5.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a cache operable to store a set of data words and an indication associated with each data word of the set of data words. The indication may be based on a quantity of accesses associated with each data word of the set of data words. The apparatus may further include a controller coupled with the cache and operable to, determine, based on receiving the first data word, a first address within the cache based on a second address indicated by a pointer and a quantity of accesses associated with a second data word stored at the second address, store the first data word at the first address within the cache based on determining the first address within the cache, and update the pointer based on a relationship between the first address and the second address.

In some examples, a quantity of accesses associated with the second data word stored at the second address may be less than a threshold number of accesses, and the first address may be the same as the second address based on the quantity of accesses associated with the second data word.

In some examples, a quantity of accesses associated with the second data word stored at the second address may be greater than a quantity of accesses associated with a third data word stored at the first address, and the first address may be sequential to the second address according to an order of addresses of the cache, the first address being sequential to the second address based on the quantity of accesses associated with the second data word.

Some examples of the apparatus may include a first CAM operable to store a first set of entries each including an address within the storage component, and a second CAM operable to store a second set of entries each including the address within the storage component, where the controller may be further operable to update an entry within the first CAM and the second CAM corresponding to the first address within the cache based on the storing the first data word.

An apparatus is described. The apparatus may include a cache coupled with a storage component associated with an address space, an interface coupled with the cache and operable to receive, from a host device, a set of access commands for storage in the storage component associated with the address space, circuitry coupled with the cache and the interface, the circuitry operable to cause the apparatus to, determine, based on receiving the first data word, a quantity of accesses associated with a second data word stored at a first address of the cache indicated by an address pointer, where each address for the cache is operable to store a data word associated with any address within the address space of the storage component, store the first data word at a second address within the cache based on the first address indicated by the address pointer and the quantity of accesses associated with the second data word, and update the address pointer based on a relationship between the first address and the second address.

In some examples, the circuitry may further be operable to cause the apparatus to determine that the quantity of accesses associated with the second data word may be greater than a threshold quantity of accesses, and compare a second quantity of accesses associated with a third data word stored at a third address of the cache different than the first address of the cache to the quantity of accesses based on the determining that the quantity of accesses may be greater than the threshold quantity of accesses, where the third address may be sequential to the first address according to an order of addresses of the cache.

In some cases, the circuitry may further be operable to cause the apparatus to determine that the quantity of accesses associated with the second data word may be less than a threshold quantity of accesses, where the second address may be the same as the first address based on the determining that the quantity of accesses may be less than the threshold quantity of accesses.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
receiving an access command indicating an address of a storage component;
evicting first data from a first address of a cache based at least in part on the cache failing to include an address of the cache associated with the address of the storage component and based at least in part on a quantity of accesses associated with the first address of the cache failing to satisfy a threshold value;
updating an entry to associate the first address of the cache with the address of the storage component based at least in part on the evicting; and
storing second data associated with the access command at the first address of the cache based at least in part on the updated entry.

2. The method of claim 1, further comprising:
determining the first address of the cache based at least in part on an address pointer indicating the first address of the cache, wherein the evicting the first data from the first address of the cache is further based at least in part on the determining the first address of the cache.

3. The method of claim 1, further comprising:
determining that a quantity of accesses associated with a second address of the cache satisfies the threshold value based at least in part on an address pointer indicating the second address of the cache; and
determining the first address of the cache based at least in part on the quantity of accesses associated with the second address of the cache satisfying the threshold value and based at least in part on the first address of the cache being sequential to the second address of the cache according to an order of addresses of the cache, wherein the evicting the first data from the first address of the cache is further based at least in part on the determining the first address of the cache.

4. The method of claim 1, further comprising:
determining that quantities of accesses associated with a plurality of addresses of the cache satisfy the threshold value based at least in part on an address pointer indicating an initial address of the plurality of addresses of the cache, the plurality of addresses of the cache comprising one or more additional addresses sequential to the initial address of the plurality of addresses of the cache according to an order of addresses of the cache; and
determining the first address of the cache based at least in part on the first address of the cache being sequential to a last address of the plurality of addresses of the cache according to the order of addresses of the cache, wherein the evicting the first data from the first address of the cache is further based at least in part on the determining the first address of the cache.

5. The method of claim 1, further comprising:
determining a plurality of addresses of the cache based at least in part on an address pointer indicating an initial address of the plurality of addresses of the cache, the plurality of addresses of the cache comprising one or more additional addresses sequential to the initial address of the plurality of addresses of the cache according to an order of addresses of the cache; and
determining the first address of the cache based at least in part on the quantity of accesses associated with the first address of the cache being less than or equal to quantities of accesses associated with other addresses of the plurality of addresses of the cache, wherein the evicting the first data from the first address of the cache is further based at least in part on the determining the first address of the cache.

6. The method of claim 1, further comprising:
determining that the first data corresponds to valid data for a second address of the storage component and has been updated from corresponding third data stored at the second address of the storage component; and
updating, prior to evicting the first data from the first address of the cache, the second address of the storage component to store the first data based at least in part on the first data corresponding to the valid data and having been updated.

7. The method of claim 6, wherein the first address of the cache comprises a first field indicating whether the first data is valid data, a second field indicating whether the first data has been updated from the corresponding third data stored at the second address of the storage component, or both.

8. The method of claim 1, further comprising:
determining that the first data corresponds to invalid data for a second address of the storage component, is the same as third data stored at the second address of the storage component, is corrupted, or any combination thereof; and
refraining from updating the second address of the storage component to store the first data based at least in part on the first data corresponding to the invalid data, the first data being the same as the third data stored at the second address of the storage component, the first data being corrupted, or any combination thereof.

9. The method of claim 8, wherein the first address of the cache comprises a first field indicating whether the first data is invalid data, a second field indicating whether the first data is the same as the third data stored at the second address of the storage component, a third field indicating whether the first data is corrupted, or any combination thereof.

10. The method of claim 1, further comprising:
updating an address pointer to indicate a second address of the cache sequential to the first address of the cache according to an order of addresses of the cache based at least in part on the evicting.

11. The method of claim 1, further comprising:
determining, by one or more content addressable memories, that a set of entries fails to include an entry associating the address of the cache with the address of the storage component, wherein the evicting is based at least in part on the determining, and wherein the entry is updated to associate the first address of the cache with the address of the storage component at the one or more content addressable memories.

12. The method of claim 1, wherein the first address of the cache comprises a field indicating the quantity of accesses associated with the first address of the cache.

13. An apparatus, comprising:
a cache operable to store a plurality of data words and an indication associated with each data word of the plurality of data words, the indication based at least in part on a quantity of accesses associated with each data word of the plurality of data words; and
a controller coupled with the cache and operable to:
receive an access command indicating an address of a storage component;
evict a first data word from a first address of the cache based at least in part on the cache failing to include an address of the cache associated with the address of the storage component and based at least in part on a first quantity of accesses associated with the first data word failing to satisfy a threshold value;
update an entry to associate the first address of the cache with the address of the storage component based at least in part on the evicting; and
store a second data word associated with the access command at the first address of the cache based at least in part on the updated entry.

14. The apparatus of claim 13, wherein the controller is further operable to:
determine the first address of the cache based at least in part on an address pointer indicating the first address of the cache, wherein the evicting the first data word from the first address of the cache is further based at least in part on the determining the first address of the cache.

15. The apparatus of claim 13, wherein the controller is further operable to:
determine that a second quantity of accesses associated with a second address of the cache satisfies the threshold value based at least in part on an address pointer indicating the second address of the cache; and
determine the first address of the cache based at least in part on the second quantity of accesses associated with the second address of the cache satisfying the threshold value and based at least in part on the first address of the cache being sequential to the second address of the cache according to an order of addresses of the cache, wherein the evicting the first data word from the first address of the cache is further based at least in part on the determining the first address of the cache.

16. The apparatus of claim 13, wherein the controller is further operable to:
determine that quantities of accesses associated with a plurality of addresses of the cache satisfy the threshold value based at least in part on an address pointer indicating an initial address of the plurality of addresses of the cache, the plurality of addresses of the cache comprising one or more additional addresses sequential to the initial address of the plurality of addresses of the cache according to an order of addresses of the cache; and
determine the first address of the cache based at least in part on the first address of the cache being sequential to a last address of the plurality of addresses of the cache according to the order of addresses of the cache, wherein the evicting the first data word from the first address of the cache is further based at least in part on the determining the first address of the cache.

17. The apparatus of claim 13, wherein the controller is further operable to:
determine a plurality of addresses of the cache based at least in part on an address pointer indicating an initial address of the plurality of addresses of the cache, the plurality of addresses of the cache comprising one or more additional addresses sequential to the initial address of the plurality of addresses of the cache according to an order of addresses of the cache; and
determine the first address of the cache based at least in part on the first quantity of accesses associated with the first address of the cache being less than or equal to quantities of accesses associated with other addresses of the plurality of addresses of the cache, wherein the evicting the first data word from the first address of the cache is further based at least in part on the determining the first address of the cache.

18. The apparatus of claim 13, wherein the controller is further operable to:

determine that the first data word corresponds to valid data for a second address of the storage component and has been updated from a corresponding third data word stored at the second address of the storage component; and update, prior to evicting the first data word from the first address of the cache, the second address of the storage component to store the first data word based at least in part on the first data word corresponding to the valid data and having been updated.

19. The apparatus of claim 13, wherein the controller is further operable to:

determine that the first data word corresponds to invalid data for a second address of the storage component, is the same as a third data word stored at the second address of the storage component, is corrupted, or any combination thereof; and refrain from updating the second address of the storage component to store the first data word based at least in part on the first data word corresponding to the invalid data, the first data word being the same as the third data word stored at the second address of the storage component, the first data word being corrupted, or any combination thereof.

20. An apparatus, comprising:

a cache configured to be coupled with a storage component, an interface coupled with the cache and operable to receive, from a host device, a plurality of access commands for storage in the storage component, and circuitry coupled with the cache and the interface, the circuitry operable to cause the apparatus to:

receive an access command indicating an address of the storage component;

evict first data from a first address of the cache based at least in part on the cache failing to include an address of the cache associated with the address of the storage component and based at least in part on a quantity of accesses associated with the first address of the cache failing to satisfy a threshold value;

update an entry to associate the first address of the cache with the address of the storage component based at least in part on the evicting; and store second data associated with the access command at the first address of the cache based at least in part on the updated entry.

* * * * *